United States Patent
Chu et al.

(10) Patent No.: US 7,944,001 B2
(45) Date of Patent: May 17, 2011

(54) POWER MOSFET INCLUDING INTER-SOURCE CONNECTION PATTERN

(75) Inventors: Kyong-Tae Chu, Gyeonggi-do (KR);
Gyu-Gwang Sim, Gyeonggi-do (KR);
Jong-Min Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 656 days.

(21) Appl. No.: 11/869,378

(22) Filed: Oct. 9, 2007

(65) Prior Publication Data
US 2008/0087953 A1    Apr. 17, 2008

(30) Foreign Application Priority Data
Oct. 16, 2006    (KR) .................. 10-2006-0100210

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .................. 257/401; 257/334; 257/E27.06

(58) Field of Classification Search .................. 257/653, 257/654, 202, 334, 377, 401, 135, 217, E27.06, 257/E29.027, E29.136
See application file for complete search history.

(56) References Cited

U.S. PATENT DOCUMENTS
2007/0045727 A1 *  3/2007  Shiraishi et al. .............. 257/335

FOREIGN PATENT DOCUMENTS
| JP | 8-162637 | 6/1996 |
| JP | 11-111976 | 4/1999 |
| JP | 2001-94101 | 4/2001 |
| JP | 2001-352063 | 12/2001 |
| JP | 2002-50760 | 2/2002 |
| JP | 2005-209731 | 8/2005 |

* cited by examiner

*Primary Examiner* — A. Sefer
*Assistant Examiner* — Dilinh P Nguyen
(74) *Attorney, Agent, or Firm* — Sherr & Vaughn, PLLC

(57) ABSTRACT

A power metal oxide silicon field effect transistor in which sources are connected to each other, a single source supplies electrons to two channels, a contact surface between the source and a channel is variously changed to be maximized such that large current flows in a small area, and an electrical field is not concentrated to a gate edge.

8 Claims, 12 Drawing Sheets

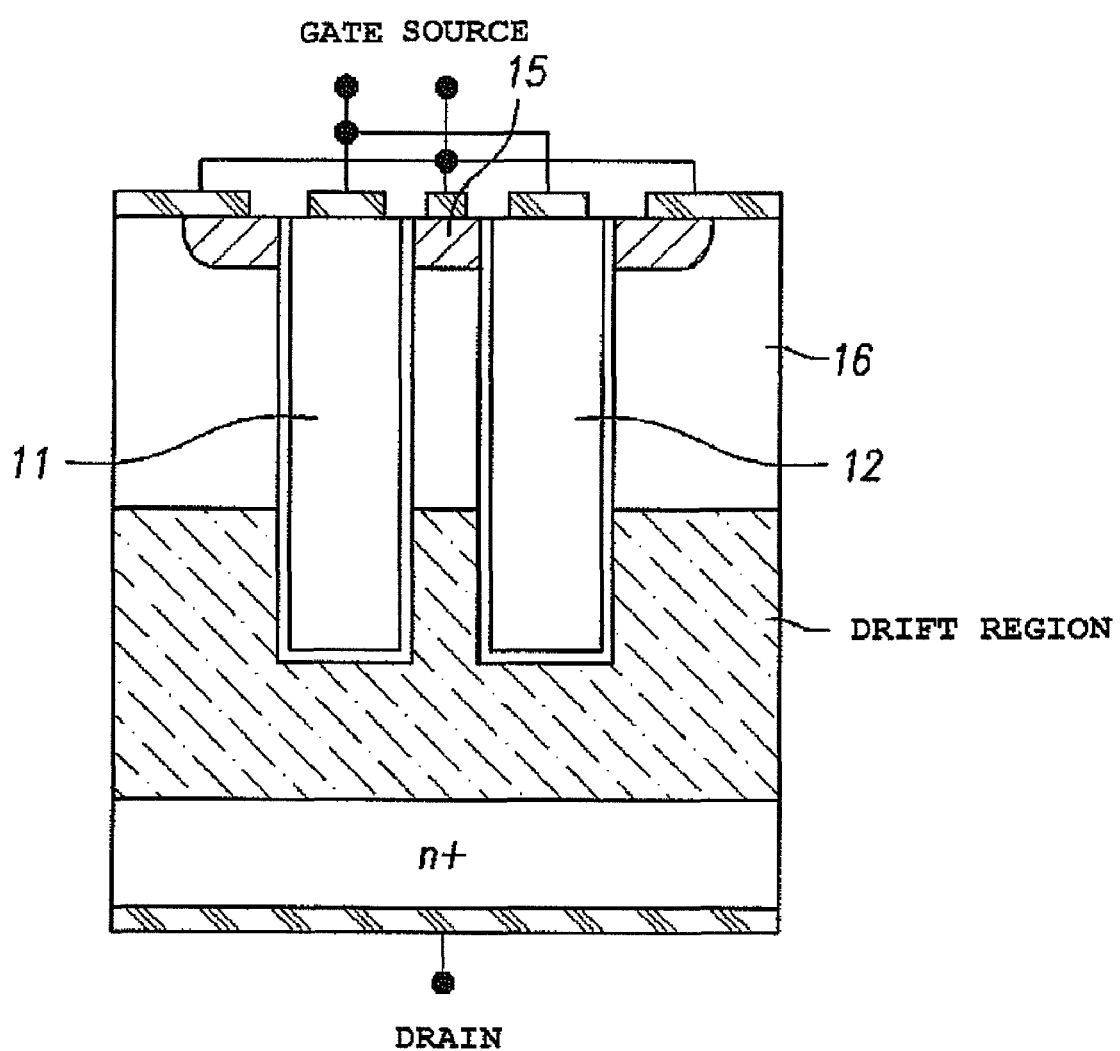

POWER MOSFET INCLUDING INTER-SOURCE CONNECTION PATTERN

Figure 1A:
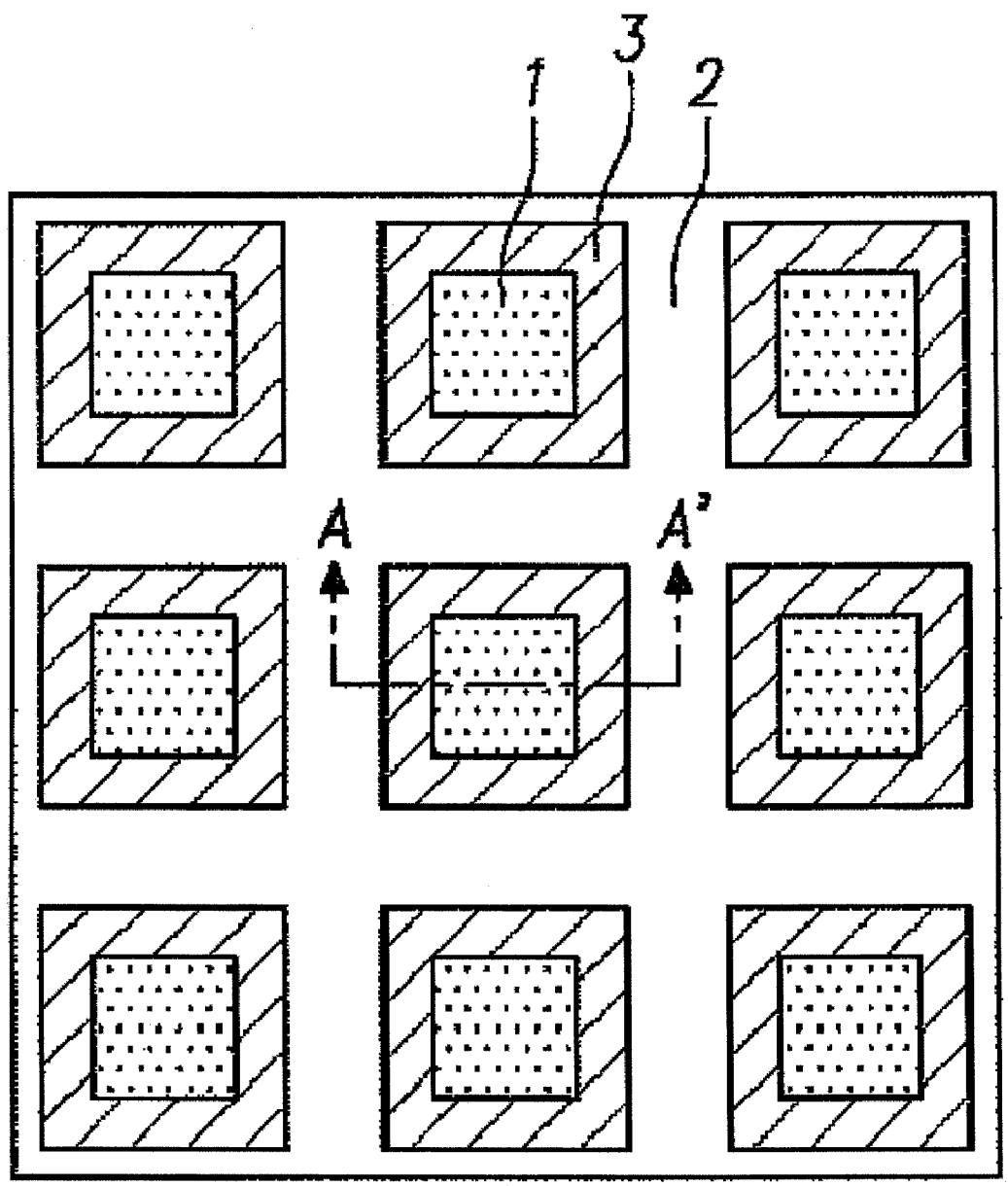

The present application claims priority under 35 U.S.C. 119 to Korean Patent Application No. P2006-0100210 (filed on Oct. 16, 2006), which is hereby incorporated by reference in its entirety.

BACKGROUND

A power MOSFET is a field effect transistor (FET) having a silicon dioxide insulating layer as an oxide insulating layer, a gate isolated from a emission source conduction channel included in a semiconductor substrate by the oxide insulating layer, and requires a gate input pulse voltage for charging or discharging input charges. The power MOSFET consumes less power than bipolar transistors.

The power MOSFET further includes source, drain, a plurality of body regions formed in the semiconductor substrate, and a gate oxide film and a gate formed on and/or over the semiconductor substrate. Metal wirings for applying electrical signals are electrically connected via contacts to upper sides of the source, drain, and gate electrodes.

Particularly, in a power MOSFET, an $n^+$-type layer and an $n^-$-type layer are formed on and/or over a semiconductor substrate, and a p-type diffusion region and an $n^+$-type region are alternately formed on and/or over a bottom surface and an uppermost surface of the substrate. The gate electrode is formed on and/or over the substrate at a position which intersects the p-type diffusion region between a pair of $n^+$-type regions with an insulating layer interposed therebtween, and the source electrode coated with glass is formed on and/or over the uppermost surface of the substrate such that the p-type diffusion region and the $n^+$-type regions are connected.

Because the drain electrode may be formed on and/or over the bottom surface of the substrate, a channel between the source region and the drain region may be longitudinally formed and may be controlled by the gate. The electrodes may be led out via a gate pad and a source pad formed on and/or over the substrate such that the gate electrode and the source electrode are electrically connected to an external device.

When a voltage is applied to the gate and the semiconductor substrate is connected to ground GND, an insulator and electrodes located on and/or over and beneath the insulator form a capacitor. When a positive (+) voltage is applied to the gate, positive (+) charges are formed in the gate and negative (−) charges are formed right beneath the insulator in a P-type substrate. At this time, the amount of positive (+) charges and negative (−) charges formed at both sides of the insulator should be equal. When a sufficient voltage is applied, a path such as a channel may be formed between the two $N^+$-type (source and drain) regions by the negative charges. When a voltage is applied to the drain in such a state, current flows along the channel. However, when the gate voltage is stopped, the channel disappears, and thus, current does not flow. Consequently, even when a constant voltage is continuously applied to the drain, the current flowing in the drain may be adjusted by adjusting the voltage applied to the gate.

Figure 1B:
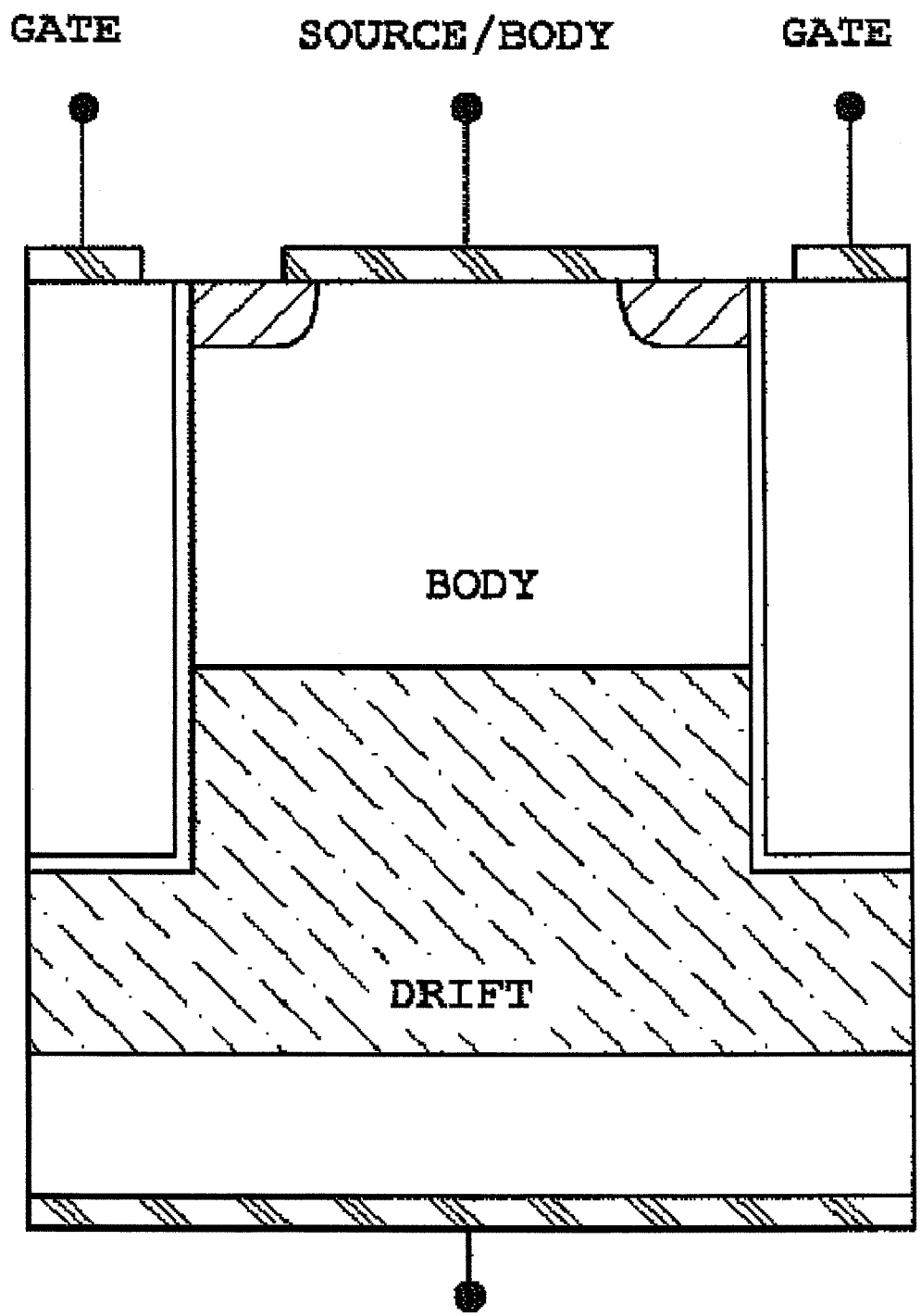

As illustrated in example FIGS. 1A and 1B, a power MOSFET may include cell or body 1 surrounded and isolated by gate 2. Body 1 may be extracted from the surface of a semiconductor substrate in order to prevent a varying potential thereof. The ratio between the area of body 1 and the overall area is large. Accordingly, the area of body 1 significantly increases in a device requiring high current driving capability. Because single source 3 applies electrons to gate 2, a contact portion between gate 2 and source 3 may be small, and thus, the current driving efficiency deteriorates.

SUMMARY

Embodiments relate to a power metal oxide silicon field effect transistor (MOSFET) capable of allowing a single source to supply electrons to two channels and variously changing a contact area between a source and gate to maximize current capability, increasing a contact area between a gate and a source to increase the channel width while occupying a small area with respect to a unit region (chip), and preventing generation of a forward bias between a source and a body region, and preventing generation of impact ionization by preventing abrupt changes at the gate.

In accordance with embodiments, a power metal oxide silicon field effect transistor (MOSFET) includes a semiconductor substrate; a plurality of gates provided over the semiconductor substrate; a plurality of body regions forming an array over a surface of the semiconductor substrate and and adjacent the plurality of gates; and a plurality of inter-source connection patterns surrounding and extending between adjacent body regions for supplying current to the plurality of gates, wherein the inter-source connection patterns have a predetermined geometric pattern extending to a contact area of the plurality of gates.

DRAWINGS

Example FIGS. 1A and 1B illustrate a power MOSFET.
Example FIGS. 2 to 8 illustrate a power MOSFET, in accordance with embodiments.

DESCRIPTION

Figure 2A:
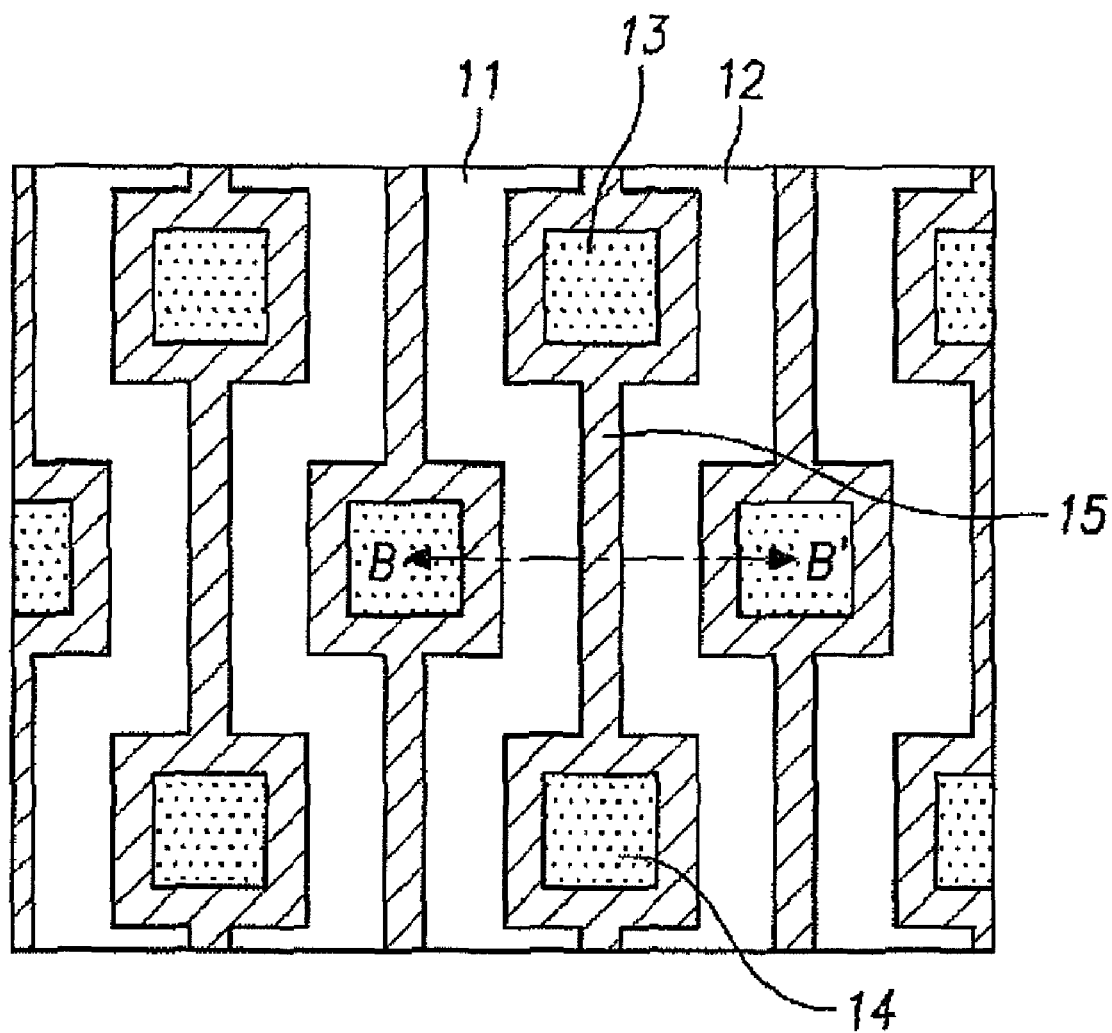

As illustrated in example FIG. 2A, a power MOSFET including inter-source connection pattern 15 formed of $n^+$-type dopants for electrically connecting first body region 13 and second body region 14 in a single direction such that each body is not isolated by the gates.

As illustrated in example FIG. 2B, in a section taken along line B-B' of example FIG. 2A, in a $n^+$-type semiconductor substrate, p-type body region 16 can be formed between an $n^+$-type region and a drift region in the form of a tunnel. Because contact areas of a pair of gates 11, 12 which electrically contact lateral sides of inter-source connection pattern 15 and the $n^+$-type region connected to first body region 13 and second body region 14 can significantly increase, current flows in both sides of inter-source connection pattern 15. Accordingly, the current capability per unit area of the power MOSFET can be further enhanced.

Figure 3:
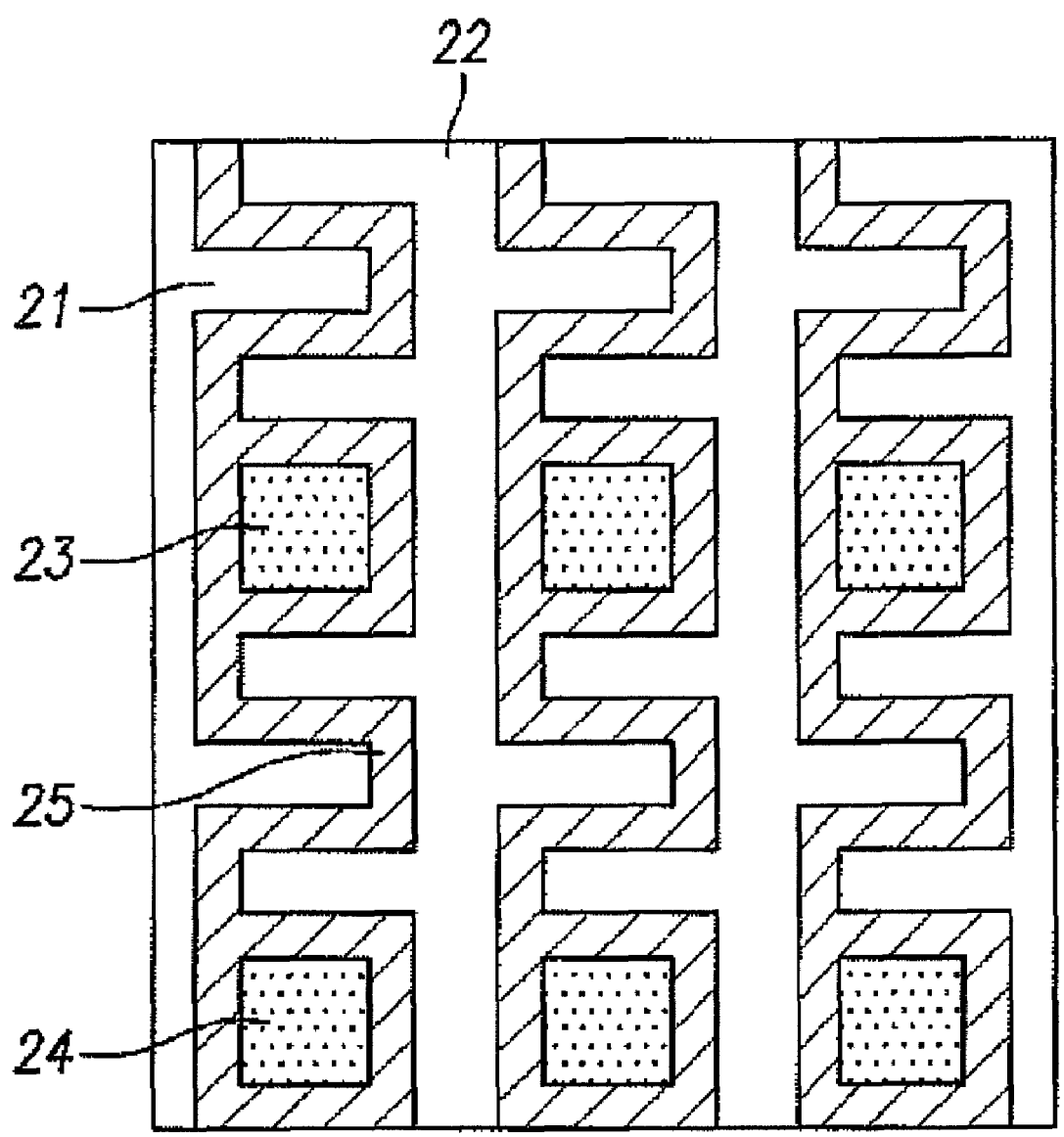

As illustrated in example FIG. 3, in accordance with embodiments a power MOSFET can include inter-source connection pattern 25 for electrically connecting first body region 23 and second body region 24 in order that a large current may flow in a channel having a small area. Inter-source connection pattern 25 having a substantially rectangular-type pattern supplies electrons to first gate 21 and second gate 22 in order to facilitate high current capability to the power MOSFET. Inter-source connection pattern 25 may extend to an area occupied by first gate 21 and second gate 22. Particularly, the electrical connection between first body region 23 and second body region 24 may include a winding or meandering or non-linear pattern instead of a linear pattern in order to reduce to the overall occupying area. The contact area of first gate 21 and second gate 22 may increase, and thus, the channel width can be efficiently enhanced.

Inter-source connection pattern 25 may have at least one of a triangular shape having a single outer corner between bent portions thereof, a rectangular shape having two outer corners between the bent portions thereof, and a sinusoidal shape without a corner. The number of non-linear patterns, i.e., the number of changed paths, may be one or at least two. Such shapes of inter-source connection pattern 25 may be selectively applied in accordance with at least one of the characteristics of the MOSFET, the area of a substrate, and the overall number of MOSFETs formed on a wafer.

Figure 4:
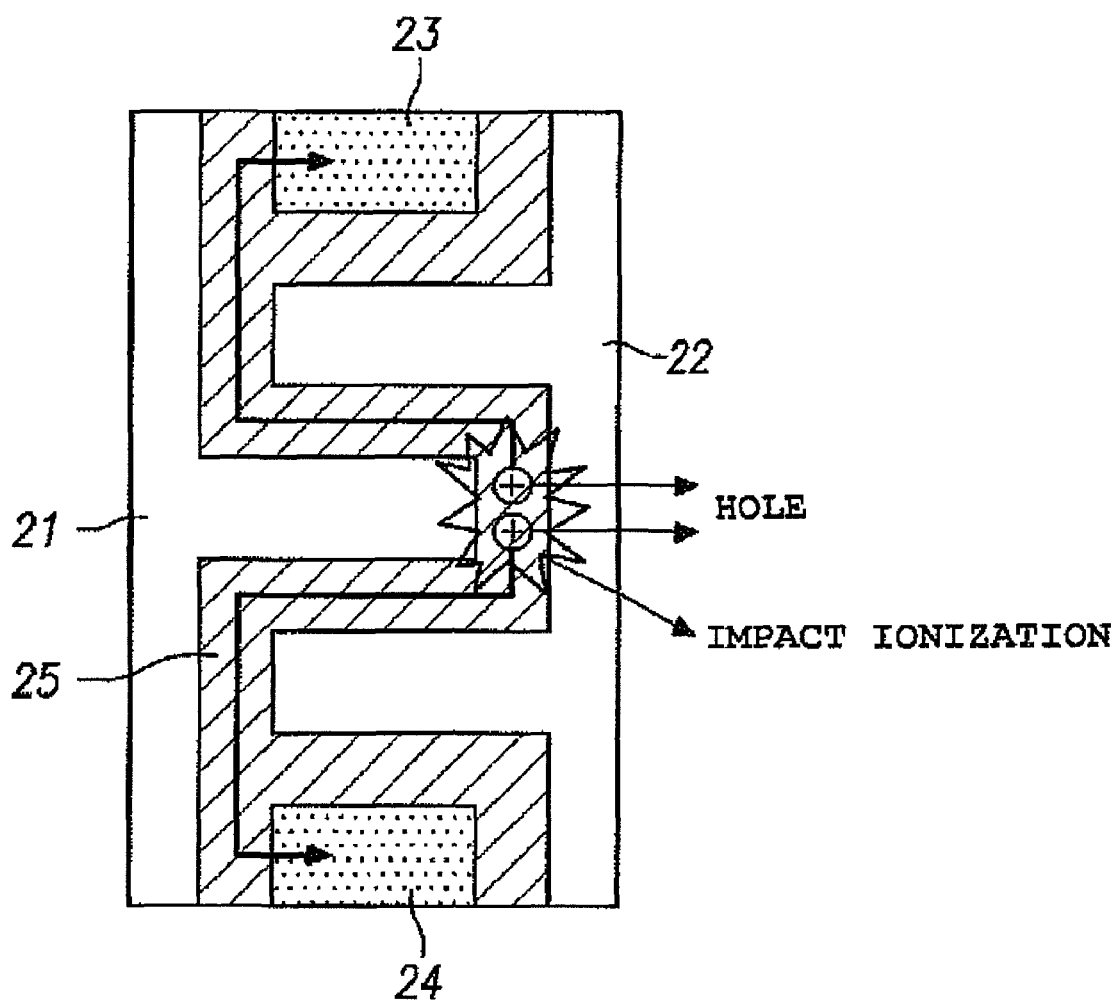

As illustrated in example FIG. 4, in accordance with embodiments a power MOSFET may include an overall structure which increases the length of inter-source connection pattern 25. The length of the path in which holes flow to the body located in the surface of the silicon substrate increases when impact ionization occurs in an inter-source connection drain region located approximately midway between first body region 23 and second body region 24. Impact ionization may occur in the entire inter-source connection drain region or adjacent to the body. If the voltage of the body increases there may be a problem of forward bias being applied between the source and the body. Therefore, the length of inter-source connection pattern 25 should increase in such a range that prevents a snap back phenomenon associated with such a non-linear pattern.

Figure 5:
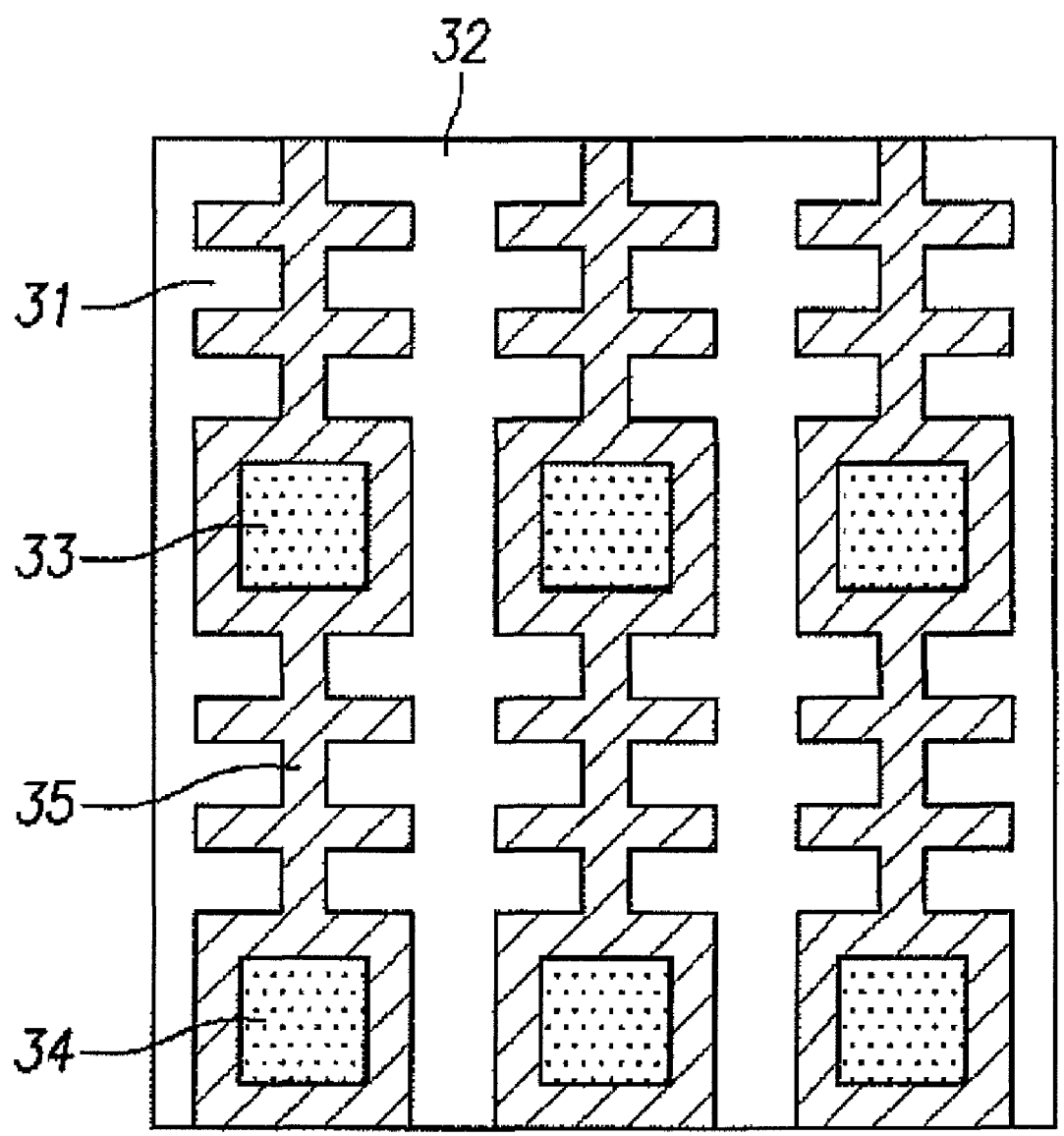
Figure 6:
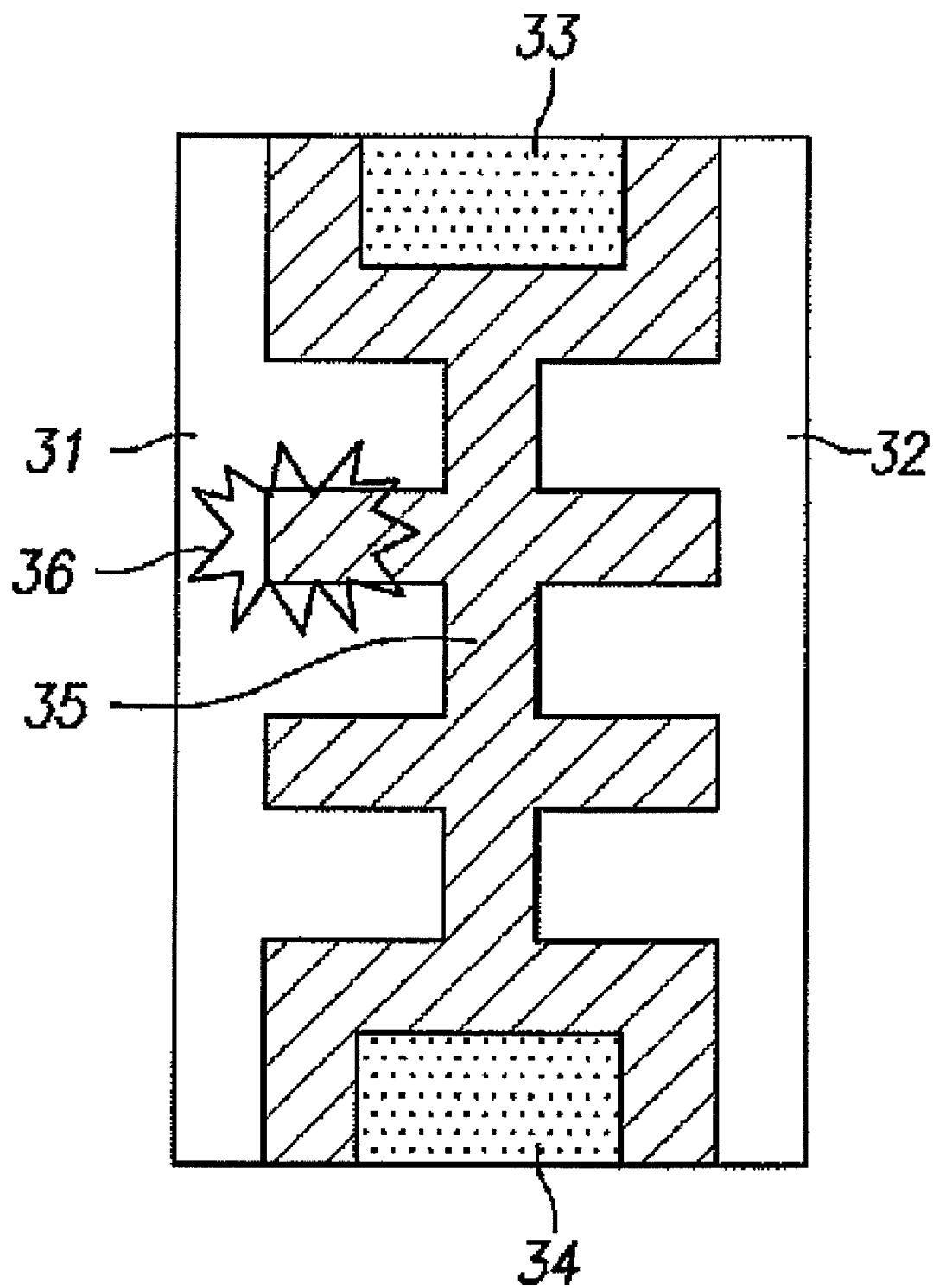

As illustrated in example FIG. 5, in accordance with embodiments a power MOSFET can include inter-source connection pattern 35 having geometric shape of a jagged or cross-type pattern with lateral extensions which perpendicularly extend from a linear path at identical positions towards first gate 31 and second gate 32 to electrically connect first body region 33 and second body region 34. Such a geometric pattern is advantageous because of the shortened distance between the body and an area where impact ionization occurs, and a decreased probability of snap back and forward bias between the source and the body. The number of extension portions may be one or at least two. Such a variation in structural design may be selectively applied in accordance with at least one of the characteristics of the MOSFET, the area of a substrate, and the number of MOSFETs formed on a wafer.

Figure 7A:
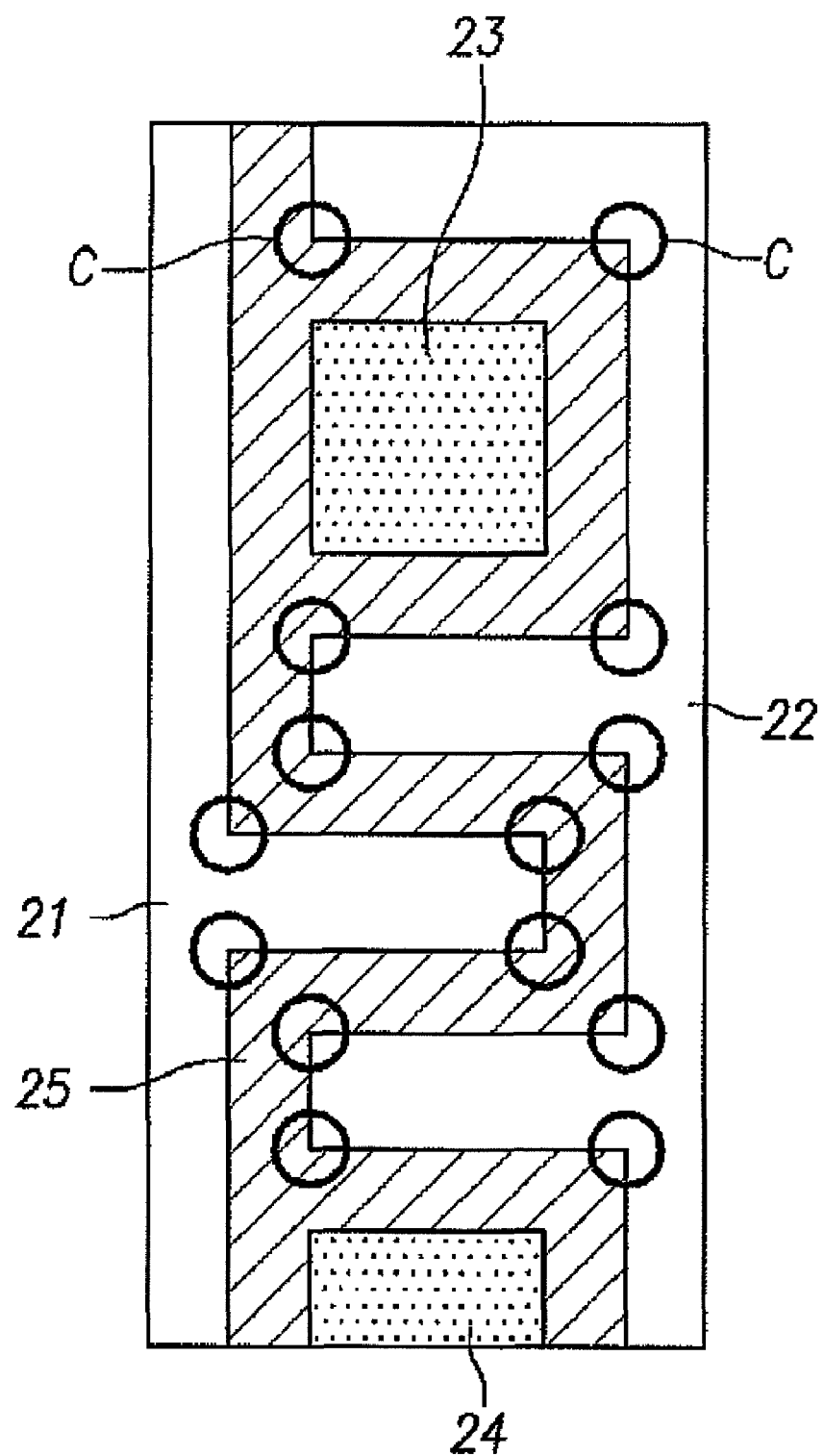
Figure 7B:
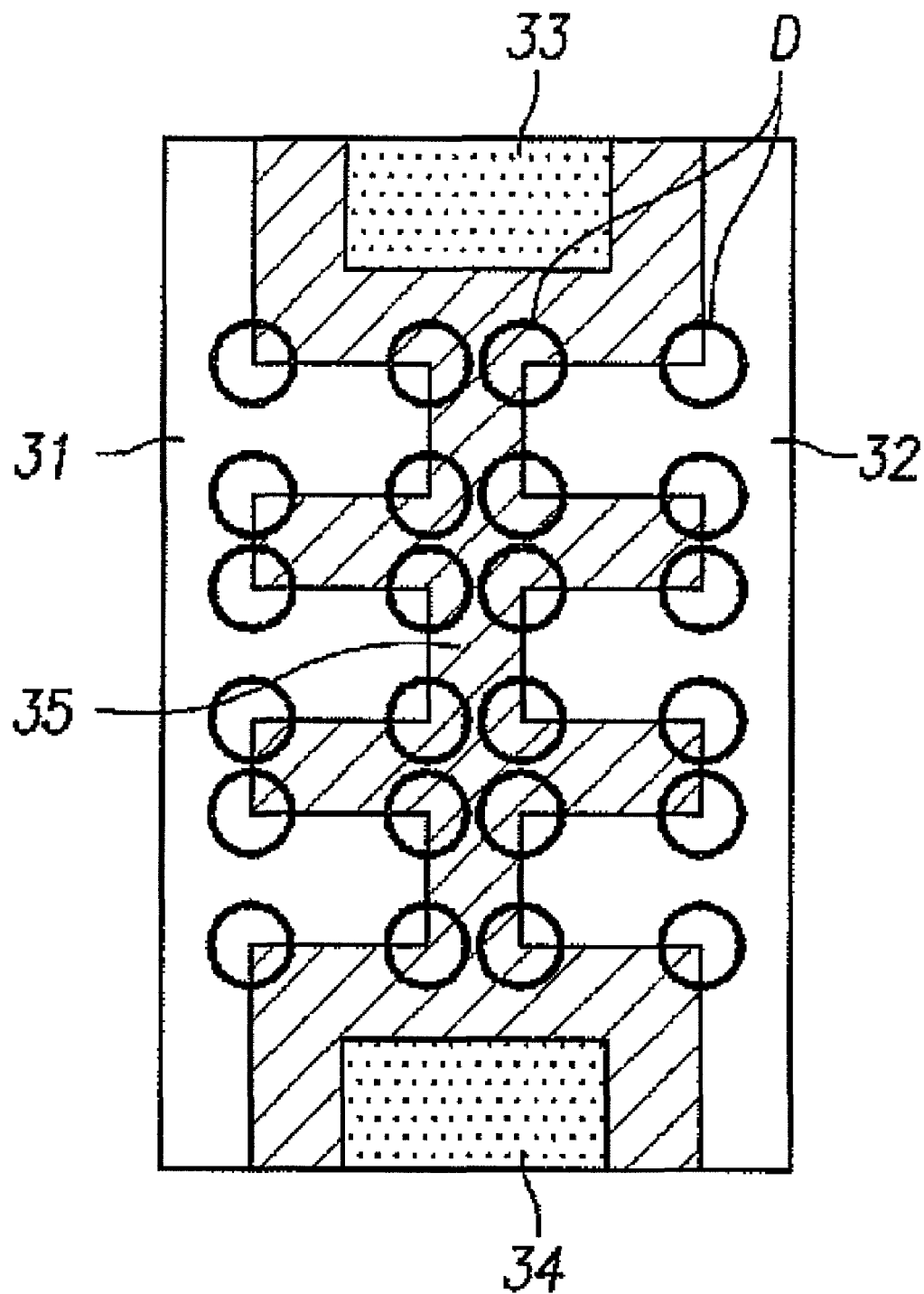

As illustrated in example FIGS. 7A and 7B, since a large electrical field C is applied to the drift region, impact ionization may easily occur in inter-source connection pattern 35. Therefore, if a region exists in which the electrical field is concentrated, a countermeasure thereof is required.

As illustrated in example FIG. 8, in accordance with embodiments, a power MOSFET includes inter-source connection 45 having extension portions with corners that are truncated such that right-angle corners are not formed between first gate 41 and second gate 42 and inter-source connection pattern 45.

Figure 8A:
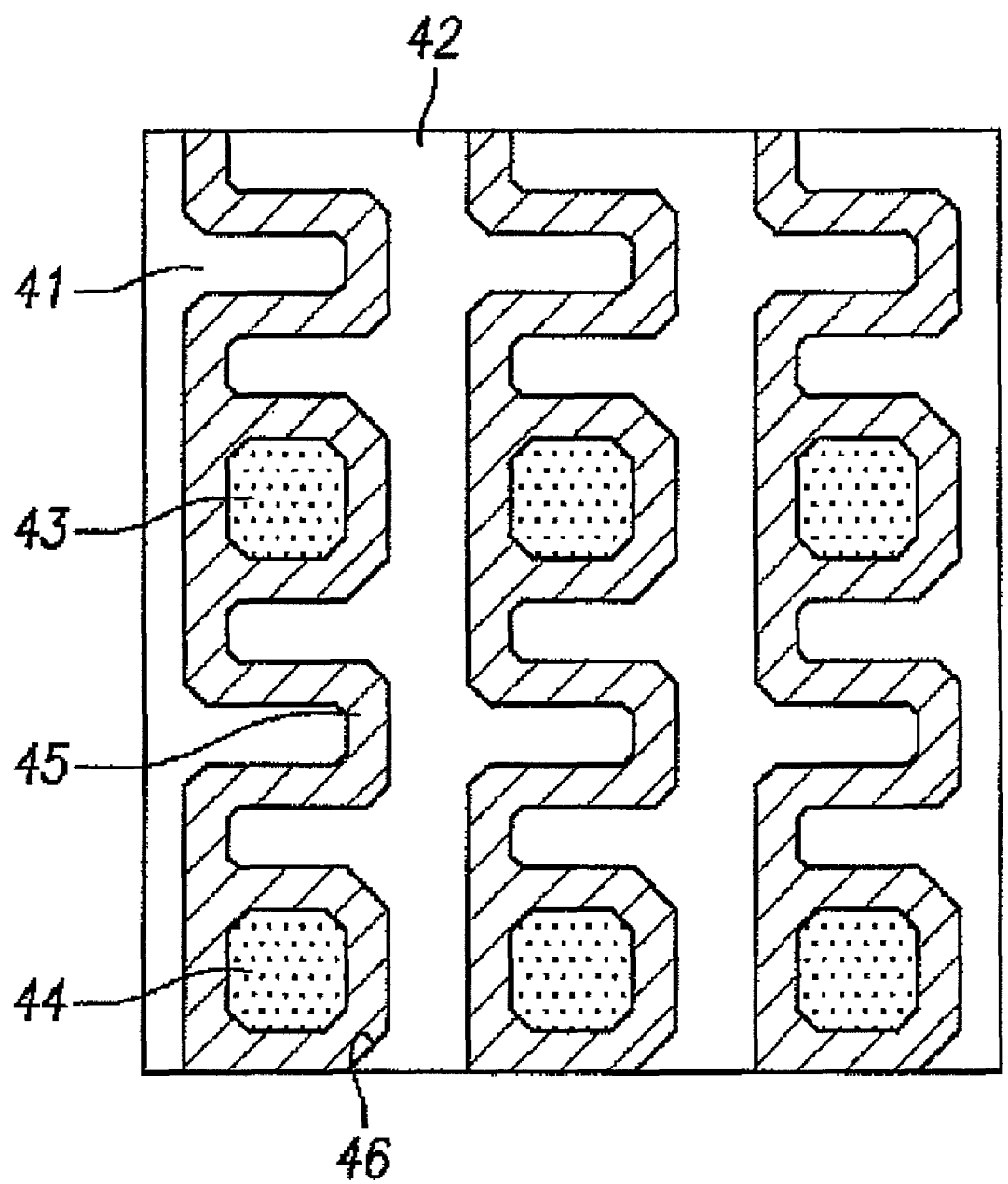
Figure 8B:
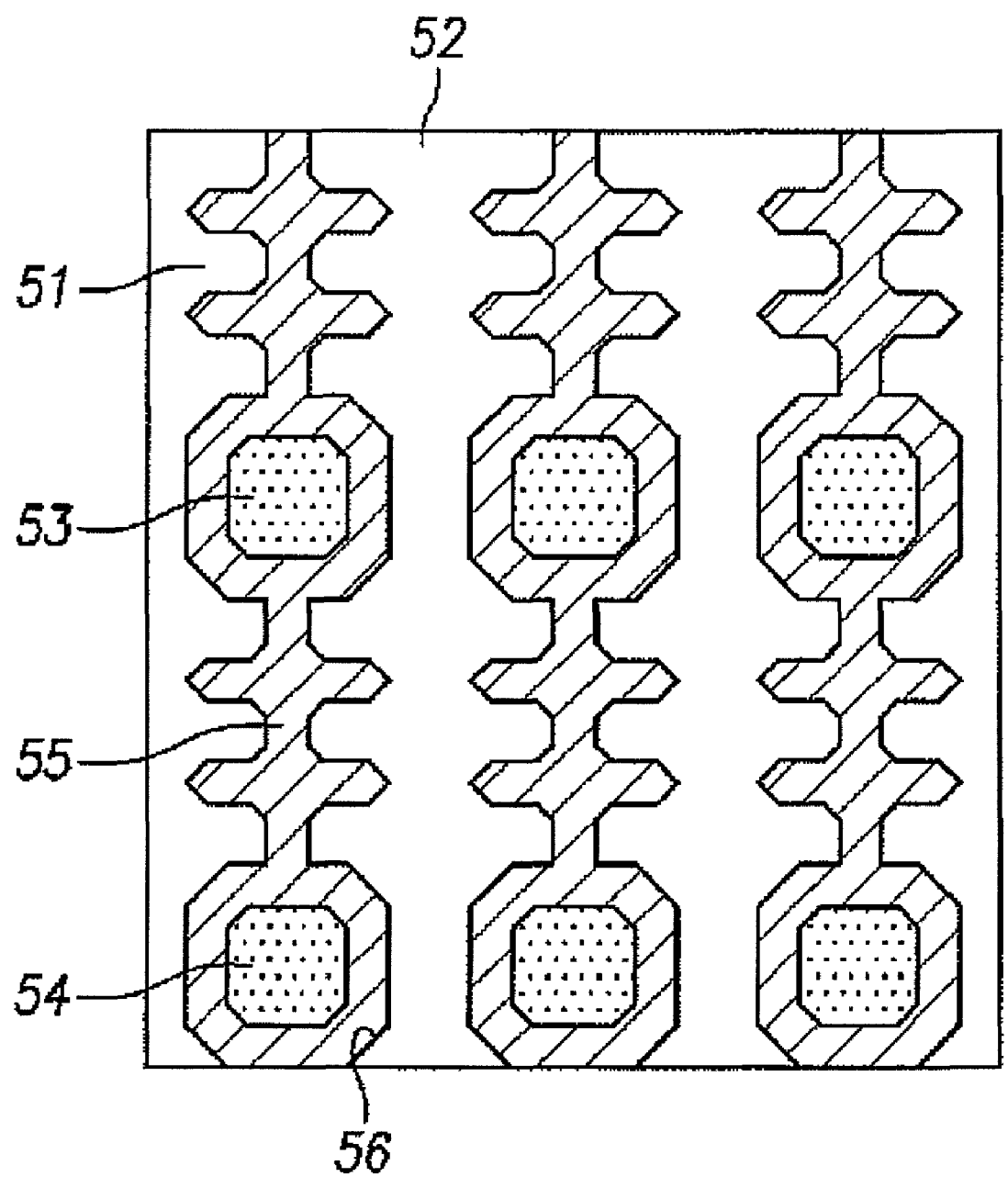

As illustrated in example FIG. 8B, the ends of the extension portions of inter-source connection pattern 55 having a jagged-type configuration are truncated such that right-angle corners are not formed between first gate 41 and second gate 42 and inter-source connection pattern 55. As illustrated in example FIGS. 8A and 8B, it can be possible to reduce concentration of an electrical field by forming chamfers 46 and 56 such that the angle of corners of first gate 41 and second gate 42 are prevented from changing abruptly.

In accordance with embodiments, it can be possible to enhance current flow efficiency by increasing a contact area between a plurality of gates and a source to increase the channel width even with occupying a small area in a unit region (chip). Generation of forward bias can also be prevented between a source and a body due to a structure which increases a contact area between a gate and the body to thereby increase the channel width. Impact ionization can be prevented by preventing the structure of gate from abruptly changing by increasing a contact area between a gate and the source to increase the channel width.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a semiconductor substrate;
   a plurality of gates provided over the semiconductor substrate;
   a plurality of body regions forming an array over the semiconductor substrate and adjacent the plurality of gates; and
   a plurality of inter-source connection patterns surrounding and extending between adjacent body regions for supplying current to the plurality of gates, wherein the inter-source connection patterns have a predetermined geometric pattern extending to a contact area of the plurality of gates,
   wherein the gates have chamfers such that an angle at corners of the gates are prevented from changing abruptly.

2. The apparatus of claim 1, wherein a portion of the inter-source connection patterns extending between adjacent body regions includes a first extension portion extending linearly between adjacent body regions and a second extension portion extending substantially perpendicular from the first extension portion in a direction toward the plurality of gates.

3. The apparatus of claim 2, wherein each distal end of the second extension portion has a substantially rectangular shape.

4. The apparatus of claim 1, wherein a portion of the inter-source connection patterns extending between adjacent body regions includes a first linear extension portion extending linearly between adjacent body regions and at least two parallel extension portions extending substantially perpendicular from the first extension portion in a direction toward the plurality of gates.

5. The apparatus of claim 4, wherein each distal end of the at least parallel extension portions has a substantially rectangular shape.

6. The apparatus of claim 1, wherein the plurality of inter-source connection patterns are formed of n+-type dopants.

7. An apparatus comprising:
   a semiconductor substrate;
   a plurality of gates provided over the semiconductor substrate;
   a plurality of body regions forming an array over the semiconductor substrate and adjacent the plurality of gates; and
   a plurality of inter-source connection patterns surrounding and extending between adjacent body regions for supplying current to the plurality of gates, wherein the inter-source connection patterns have a predetermined geometric pattern extending to a contact area of the plurality of gates, wherein a portion of the inter-source connection patterns extending between adjacent body regions includes a first extension portion extending linearly between adjacent body regions and a second extension portion extending substantially perpendicular from the first extension portion in a direction toward the plurality of gates, and wherein each distal end of the second extension portion has a substantially triangular shape.

8. An apparatus comprising:

a semiconductor substrate;

a plurality of gates provided over the semiconductor substrate;

a plurality of body regions forming an array over the semiconductor substrate and adjacent the plurality of gates; and a plurality of inter-source connection patterns surrounding and extending between adjacent body regions for supplying current to the plurality of gates, wherein a portion of the inter-source connection patterns extending between adjacent body regions includes a first linear extension portion extending linearly between adjacent body regions and at least two parallel extension portions extending substantially perpendicular from the first extension portion in a direction toward the plurality of gates, wherein the gates have chamfers such that an angle at corners of the gates are prevented from changing abruptly.

* * * * *